(12) United States Patent
Lee et al.

(10) Patent No.: US 10,390,448 B2
(45) Date of Patent: Aug. 20, 2019

(54) CURVED DISPLAY DEVICE HAVING IMPROVED DISPLAY AREA

(71) Applicant: Samsung Display Co., Ltd., Yongin-Si, Gyeonggi-Do (KR)

(72) Inventors: Jong Soo Lee, Yongin-si (KR); Hyoung Suk Roh, Cheonan-si (KR); Beom Gyu Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/458,669

(22) Filed: Mar. 14, 2017

(65) Prior Publication Data
US 2017/0273199 A1    Sep. 21, 2017

(30) Foreign Application Priority Data
Mar. 17, 2016  (KR) .................. 10-2016-0032369

(51) Int. Cl.
| | |
|---|---|
| *H05K 5/02* | (2006.01) |
| *H01L 27/146* | (2006.01) |
| *H01L 51/00* | (2006.01) |
| *H01L 51/52* | (2006.01) |
| *H05K 5/03* | (2006.01) |
| *G02F 1/1333* | (2006.01) |

(52) U.S. Cl.
CPC ......... *H05K 5/02* (2013.01); *G02F 1/133305* (2013.01); *H01L 27/14612* (2013.01); *H01L 27/14623* (2013.01); *H01L 27/14636* (2013.01); *H01L 51/0097* (2013.01); *H01L 51/5246* (2013.01); *H05K 5/03* (2013.01); *G02F 2001/133342* (2013.01); *G02F 2201/46* (2013.01); *Y02E 10/549* (2013.01)

(58) Field of Classification Search
CPC ........ H05K 5/02; H05K 5/03; H01L 51/0097; H01L 51/5246; H01L 27/14623; H01L 27/14612; H01L 27/14636
See application file for complete search history.

(56) References Cited

U.S. PATENT DOCUMENTS

2005/0286214 A1* 12/2005 Chen ............... G06F 1/1601
                                                361/679.21
2011/0242742 A1* 10/2011 Kim ................ H04N 5/64
                                                361/679.01

(Continued)

FOREIGN PATENT DOCUMENTS

| KR | 10-2013-0007311 A | 1/2013 |
| KR | 10-2014-0045593 A | 4/2014 |

(Continued)

*Primary Examiner* — Anatoly Vortman
*Assistant Examiner* — Stephen S Sul
(74) *Attorney, Agent, or Firm* — Innovation Counsel LLP

(57) ABSTRACT

A display device includes: a first display unit and a second display unit respectively including a planar portion for displaying an image from a front of the display device, a curved portion extending from the planar portion and configured to display an image, and a side portion extending from the curved portion and configured to display an image from a side of the display device, the first display unit and the second display unit provided to be opposite to each other and bonded to each other at the side portion; and an adhesive layer bonding the first display unit to the second display unit.

15 Claims, 6 Drawing Sheets

(56) References Cited

U.S. PATENT DOCUMENTS

| | | | |
|---|---|---|---|
| 2012/0113614 A1* | 5/2012 | Watanabe | G02F 1/13336 |
| | | | 361/810 |
| 2013/0002133 A1* | 1/2013 | Jin | G09F 9/33 |
| | | | 313/511 |
| 2013/0076612 A1 | 3/2013 | Myers | |
| 2014/0085907 A1* | 3/2014 | Jun | G09G 3/3208 |
| | | | 362/362 |
| 2014/0267097 A1* | 9/2014 | Lee | G06F 3/0412 |
| | | | 345/173 |
| 2015/0062841 A1* | 3/2015 | Jin | H04M 1/0266 |
| | | | 361/749 |
| 2015/0227172 A1* | 8/2015 | Namkung | G06F 1/1652 |
| | | | 345/173 |
| 2015/0235609 A1* | 8/2015 | Hall | G09G 5/003 |
| | | | 345/520 |
| 2016/0210103 A1* | 7/2016 | Yoshizumi | G06F 3/1446 |
| 2016/0345446 A1* | 11/2016 | Zhu | H01L 51/524 |
| 2017/0263179 A1* | 9/2017 | Aurongzeb | G09G 3/3225 |

FOREIGN PATENT DOCUMENTS

| | | |
|---|---|---|
| KR | 10-1482629 B1 | 1/2015 |
| KR | 10-2015-0064337 A | 6/2015 |
| KR | 10-2015-0099676 A | 9/2015 |

\* cited by examiner

US 10,390,448 B2

CURVED DISPLAY DEVICE HAVING IMPROVED DISPLAY AREA

CROSS-REFERENCE TO RELATED APPLICATION

This application claims priority to, and the benefit of, Korean Patent Application No. 10-2016-0032369 filed in the Korean Intellectual Property Office on Mar. 17, 2016, the entire contents of which are incorporated herein by reference.

BACKGROUND OF THE INVENTION (a) Technical Field

The present disclosure relates generally to display devices, and particularly to curved display devices having a display screen with an extended area.

(b) Description of the Related Art

Recently, flexible display devices have been emphasized as potential next-generation display devices, and among them, curved display devices of which at least a part is bent or may be bent have been actively developed.

The curved display device may be generated to have a shape in which an entire display panel is bent with a constant curvature, or it may include curved portions that are bent at respective end portions of the display panel in a first direction. The curved display device is attached to a set frame by an adhesive tape or an adhesive solution provided to an edge, and is then assembled.

The curved display device may display an image on one side and may not display it on a lateral side and a rear side, so display devices for displaying images on all surfaces have recently been under development.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a display device for combining two curved display units through a combination member made of a transparent material, thereby being capable of displaying an image over an entire surface.

An exemplary embodiment of the present invention provides a display device including: a first display unit and a second display unit respectively including a planar portion for displaying an image from a front of the display device, a curved portion extending from the planar portion and configured to display an image, and a side portion extending from the curved portion and configured to display an image from a side of the display device, the first display unit and the second display unit provided to be opposite to each other and bonded to each other at the side portion; and an adhesive layer bonding the first display unit to the second display unit.

The display device may further include a combination member for covering the side portion of the first display unit and the side portion of the second display unit, and for combining the first display unit and the second display unit, wherein the combination member may include a transparent material.

The combination member may include: a center portion; a first combiner extending toward the planar portion of the first display unit from the center portion, so as to be coupled to the first display unit; a second combiner extending toward the planar portion of the second display unit from the center portion, so as to be coupled to the second display unit; and a support protruding toward the side portions of the first display unit and the second display unit from the center portion.

The support may extend to an interface between the side portions of the first display unit and the second display unit.

The combination member may further include: a first fixer provided at an end portion of the first combiner and fixing the combination member to the first display unit; and a second fixer provided at an end portion of the second combiner and fixing the combination member to the second display unit.

The first combiner or the second combiner may be oriented at an angle of 1 to 89° with respect to one of the side portions.

The first combiner or the second combiner may be oriented at angle of 1 to 10° with respect to one of the side portions.

A space may be provided between at least one of the side portions and the combination member.

The combination member may include at least one of a polycarbonate and an acryl.

The adhesive layer may include at least one of a pressure sensitive adhesive (PSA), an optically clear adhesive (OCA), a silicone adhesive, and an acryl adhesive.

The display device may further include first and second cover windows respectively covering the first and second display units. The adhesive layer may include an internal-side adhesive region affixed to at least part of each of the side portions, a panel adhesive region affixed to the first display panel and the second display panel, and a window adhesive region affixed to the first cover window and the second cover window, and the internal-side adhesive region, the panel adhesive region, and the window adhesive region may have different thicknesses.

The internal-side adhesive region may be thicker than the panel adhesive region, and the panel adhesive region may be thicker than the window adhesive region.

The adhesive layer may further include a light blocking material.

The first display unit may include a first display panel for displaying an image and a first cover window for covering a display side of the first display panel, and the second display unit may include a second display panel for displaying an image and a second cover window for covering a display side of the second display panel.

According to the exemplary embodiment of the present invention, two curved display units are combined through the combination member made of a transparent material, thereby being capable of displaying an image over the entire surface of the display device.

DETAILED DESCRIPTION OF THE EMBODIMENTS

Figure 1:
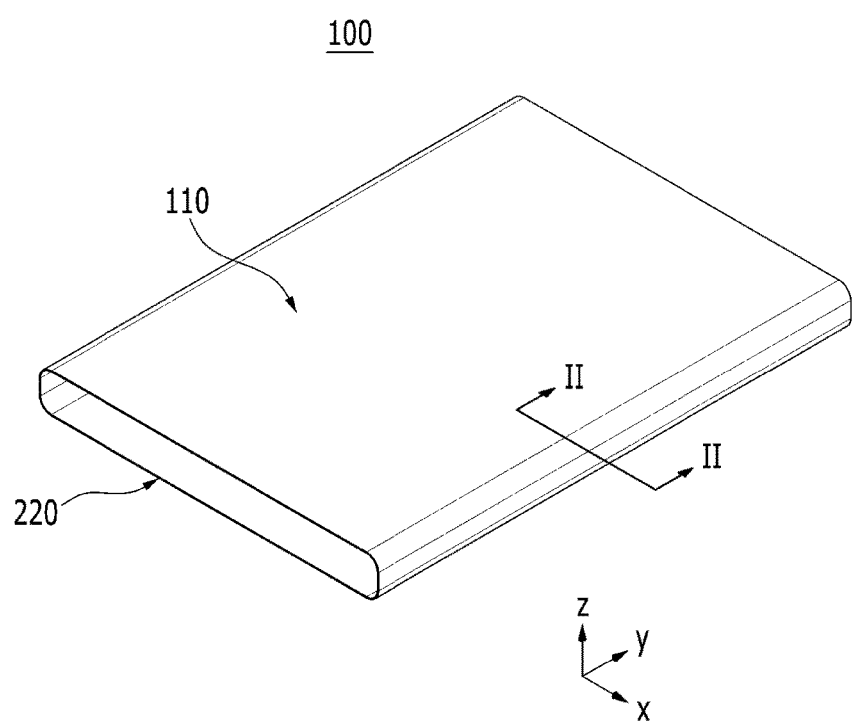
FIG. 1 shows a perspective view of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. The drawings thus may not be to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, throughout the specification, "thickness" signifies a distance in the z-axis direction on the drawing, and "length" signifies a distance in the y-axis direction on the drawing.

All numerical values are approximate, and may vary. All examples of specific materials and compositions are to be taken as nonlimiting and exemplary only. Other suitable materials and compositions may be used instead.

A display device according to an exemplary embodiment of the present invention will now be described in detail with reference to accompanying drawings.

A display device according to an exemplary embodiment of the present invention will now be described with reference to FIG. 1 to FIG. 3.

Figure 2:
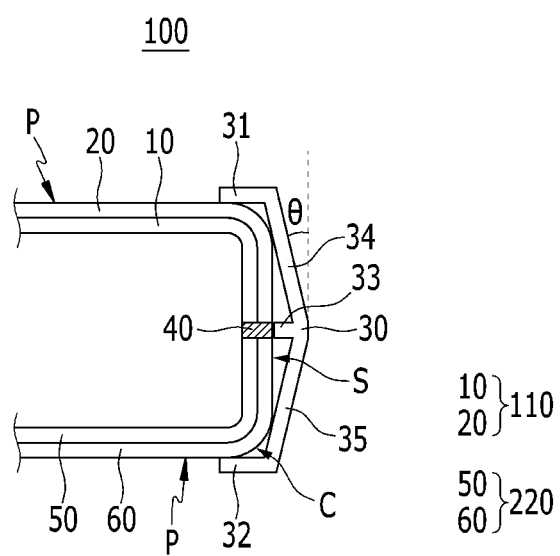
FIG. 2 shows a cross-sectional view with respect to a line II-II shown in FIG. 1.
Figure 3:
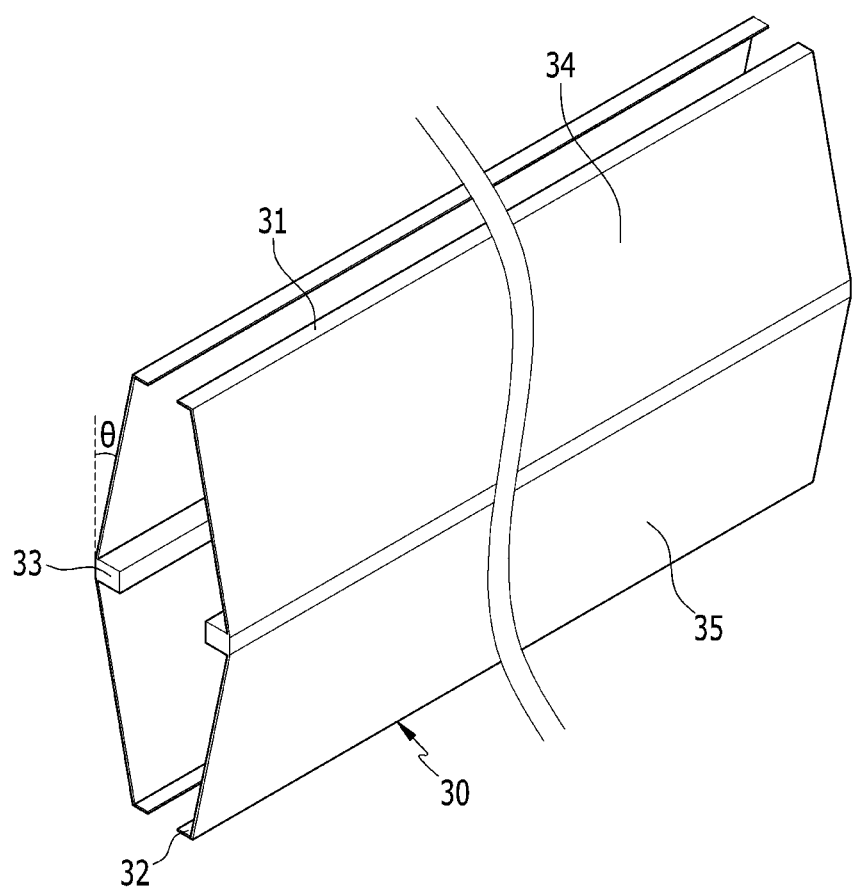
FIG. 3 shows a perspective view of a combination member according to an exemplary embodiment of the present invention.

FIG. 1 shows a perspective view of a display device according to an exemplary embodiment of the present invention, FIG. 2 shows a cross-sectional view with respect to a line II-II shown in FIG. 1, and FIG. 3 shows a perspective view of a combination member according to an exemplary embodiment of the present invention.

Referring to FIG. 1 to FIG. 3, regarding the display device 100, a first display unit 110 and a second display unit 220 including a planar portion (P) for displaying an image to the front, a curved portion (C) of which respective end portions are bent according to a first direction, and a side portion (S) for displaying an image to the side, configure an upper portion and a lower portion of the display device 100. The first display unit 110 and the second display unit 220 may allow the planar portion (P), the curved portion (C), and the side portion (S) to display the image. That is, the display device 100 may display the image on the whole surface of the upper portion, the lower portion, and the side portion of the display device 100.

The first display unit 110 and the second display unit 220 are provided to be opposite to each other and are bonded together at the side portion (S). That is, the first display unit 110 and the second display unit 220 are provided to face the rear side, i.e. the opposite side, of the planar portion (P), for displaying each image.

An adhesive layer 40 is provided on bonded sides of the side portion (S) of the first display unit 110 and the second display unit 220, to mutually bond the first display unit 110 and the second display unit 220.

A combination member 30 for reinforcing the combination of the bonded display units 110 and 220 is fixed to the side portion (S) of the first display unit 110 and the second display unit 220.

The first display unit 110 includes a first display panel 10 and a first cover window 20 provided on a surface of the first display panel 10 to protect the surface of the first display panel 10, and the second display unit 220 includes a second display panel 50 and a second cover window 60 provided on a surface of the second display panel 50 to protect the second display panel 50.

The first display panel 10 and the second display panel 50 may be flexible display panels including a substrate (not shown) made of flexible polymers. A plurality of signal lines (not shown) including a plurality of scan lines and a plurality of data lines, and a plurality of pixels (not shown), may be provided on display areas of the display panels 10 and 50.

A configuration for driving a display device, such as a circuit board for displaying an image, may be provided on respective rear sides of the first and second display units 110 and 220 that are generated to be cured and are then combined. Therefore, a support structure including a driving circuit substrate may be provided between the first display unit 110 and the second display unit 220. The configuration of the driving circuit substrate may be disposed on the rear sides of the first and second display units 110 and 220 to minimize a bezel area of the display device 100.

At least a part of each of the first display panel 10 and the second display panel 50 is generated to be curved. For example, the display panels 10 and 50 may respectively include a planar portion (P), a pair of curved portions (C) provided on respective end portions of the planar portion (P), and a side portion (S) extending from the curved portion (C) to be perpendicular with respect to the planar portion (P).

The cover windows 20 and 60 are provided outside the display sides of the display panels 10 and 50 and are generated to have a shape corresponding to the display panels 10 and 50. That is, the cover windows 20 and 60 cover the planar portions (P), the curved portions (C), and the side portions (S) of the display panels 10 and 50, and are generated to have the same shape as the display panels 10 and 50.

The first display unit 110 and the second display unit 220 are bonded by the adhesive layer 40 which is applied to the outermost sides of the first display unit 110 and the second display unit 220.

The adhesive layer 40 may be made of at least one of a pressure sensitive adhesive (PSA), an optically clear adhesive (OCA), a silicon adhesive, and an acryl adhesive.

The combination member 30 covers the respective side portions (S) of the display device 100, and is assembled to be fixed to the surfaces of the cover windows 20 and 60 to generate the external shape of the display device 100.

The combination member 30 includes a first combiner 34 extending in a first direction from a center portion and affixed to the surface of the first display unit 110, and a second combiner 35 extending in a second direction from the center portion and affixed to the surface of the second display unit 220. End portions of the first combiner 34 and the second combiner 35 include a first fixer 31 and a second fixer 32, and the combination member 30 may be fixed to the display device 100 by the fixers 31 and 32.

The first fixer 31 is a member that extends and is bent from the first combiner 34, and the second fixer 32 is a member that extends and is bent from the second combiner 35 at a constant angle, so that the first fixer 31 may fix the combination member 30 to the first display unit 110 and the second fixer 32 may fix the combination member 30 to the second display unit 220.

The combination member 30 may further include a support 33 protruding toward the side portion (S) of the display device 100 from the center portion of the combination member 30 so as to generate a predetermined space between the combination member 30 and the display device 100. The support 33 may also be generated to continuously extend in a length direction of the side portion (S) of the display device 100.

The first combiner 34 and the second combiner 35 may each have a constant angle θ with respect to the surface of the side portion (S) of the display device 100.

The angle θ of the surfaces of the combiners 34 and 35 extending from the support 33 may be set to be within the range of 1 to 89° with respect to the surface of the side portion (S) of the display device 100, and desirably 1 to 10°.

A predetermined space is generated between the combiners 34 and 35 of the combination member 30 and the display device 100 through the support 33, thereby reducing the severity of impacts that may be applied to the display device 100.

The combination member 30 may be generated of a transparent material since it is made to display images from the respective side portions (S) of the display device 100 to. The combination member 30 may be exemplarily made of a transparent polycarbonate (PC) or a transparent acryl.

By combining the two display units 110 and 220 by use of the combination member 30 made of a transparent material, the combination of the two display units 110 and 220 may be improved, impact damage may be reduced, and the image may be displayed on all sides including the upper portion, the lower portion, and the side portion of the display device 100.

Further, the manufacturing process may be simplified and made cheaper as compared to the whole-surface display device generated by use of one display panel.

A display device according to another exemplary embodiment of the present invention will now be described with reference to FIG. 4.

Figure 4:
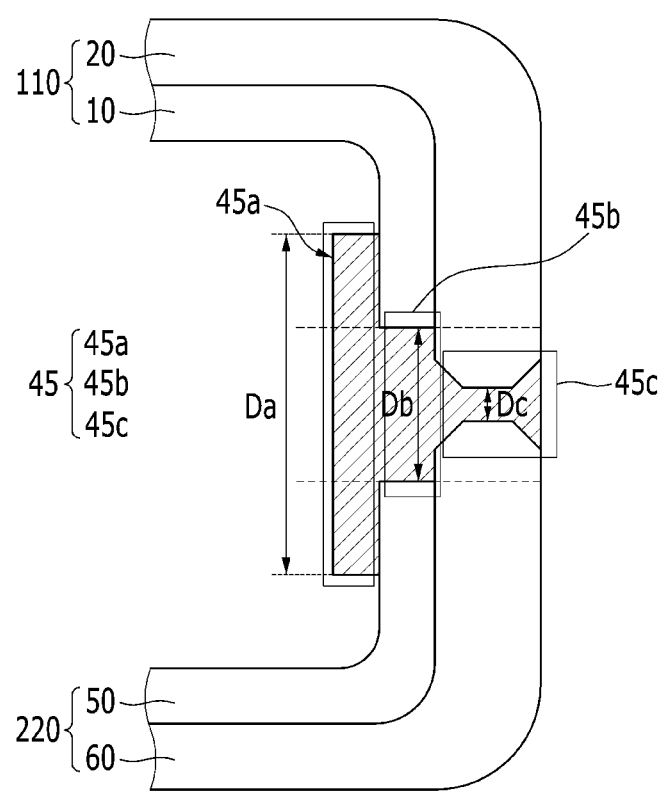
FIG. 4 shows a cross-sectional view of a display device according to another exemplary embodiment of the present invention.

FIG. 4 shows a cross-sectional view of a display device according to another exemplary embodiment of the present invention.

The display device according to the current exemplary embodiment of the present invention shown in FIG. 4 corresponds to the exemplary embodiment described with reference to FIG. 1 to FIG. 3 except for the configuration of an adhesive layer, so repeated portions will not be further described.

Referring to FIG. 4, the adhesive layer 45 of the display device according to the other exemplary embodiment of the present invention includes an internal-side adhesive region 45a affixed to an internal side of the side portions of the first display panel 10 and the second display panel 50, a panel adhesive region 45b affixed to the first and second display panels 10 and 50, and a window adhesive region 45c affixed to the first and second cover windows 20 and 60.

From the internal-side adhesive region 45a, to the panel adhesive region 45b, and to the window adhesive region 45c, thicknesses (Da, Db, and Dc) thereof may successively decrease.

The thicknesses of the adhesive regions 45a, 45b, and 45c decrease toward the outside from the interior of the display device 100 as described, so the adhesive area of the adhesive layer 45 and the display device 100 may be increased thereby improving the combination of the first display unit 110 and the second display unit 220.

The adhesive layer 45 according to another exemplary embodiment of the present invention may further include a light blocking material.

Regarding the display device 100 according to the current exemplary embodiment of the present invention, the adhesive area of the adhesive layer 45 may be increased so a sufficient combination force may be provided between the first display unit 110 and the second display unit 220 without a combination member, and the combination member according to an exemplary embodiment of FIG. 1 to FIG. 3 may be omitted.

The display device according to the present invention shown in FIG. 1 to FIG. 4 may be generated with an organic light emitting panel, and in this case, each pixel generated on the display panel may include an organic light emitting element so as to realize the image.

A pixel of a display panel according to an exemplary embodiment of the present invention will now be described with reference to FIG. 5 and FIG. 6.

Figure 5:
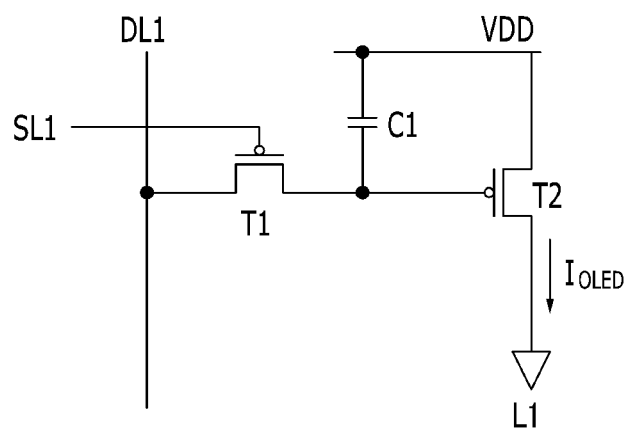
FIG. 5 shows a pixel circuit diagram of a display panel according to an exemplary embodiment of the present invention.
Figure 6:
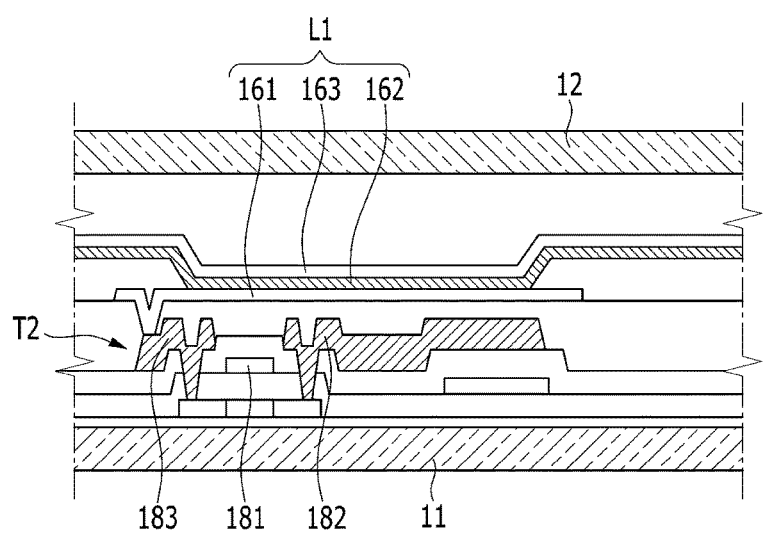
FIG. 6 shows a cross-sectional view of a pixel of a display panel according to an exemplary embodiment of the present invention.

FIG. 5 shows a pixel circuit diagram of a display panel according to an exemplary embodiment of the present invention, and FIG. 6 shows a cross-sectional view of a pixel of a display panel according to an exemplary embodiment of the present invention.

Referring to FIG. 5 and FIG. 6, the pixel includes an organic light emitting diode L1 and a driving circuit portion (T1, T2, and C1). The organic light emitting diode L1 includes a pixel electrode 161, an organic emission layer 162, and a common electrode 163. The driving circuit portion (T1, T2, and C1) includes at least two thin film transistors (a switching transistor T1 and a driving transistor T2) and at least one capacitor C1.

The switching transistor T1 is connected to a scan line SL1 and a data line DL1, and transmits a data voltage from the data line DL1 to the driving transistor T2 according to a switching voltage provided to the scan line SL1. The capacitor C1 is connected to the switching transistor T1 and a power line (VDD), and stores a voltage that corresponds to a difference between the voltage transmitted by the switching transistor T1 and the voltage supplied to the power line (VDD).

The driving transistor T2 is connected to the power line (VDD) and the capacitor C1 to supply an output current ($I_{OLED}$), that is proportional to a square of the difference between the voltage stored in the capacitor C1 and a threshold voltage, to the organic light emitting diode L1. The organic light emitting diode L1 emits light with intensity that is proportional to the output current ($I_{OLED}$). The driving transistor T2 includes a gate electrode 181, and source/drain electrodes 182 and 183, and the pixel electrode 161 may be connected to the drain electrode 183 of the driving transistor T2.

The organic light emitting device shown in FIG. 5 and FIG. 6 is an example of a device employed within the display panel, and the display device according to the present exemplary embodiment is not limited to the above-described organic light emitting device. Rather, it may be modifiable in various ways, and a liquid crystal display instead of the organic light emitting device may be applicable.

According to the exemplary embodiments of the present invention, two curved display devices are combined through a combination member made of a transparent material so the image may be displayed on the whole surface of the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

What is claimed is:

1. A display device comprising:
   a first display unit and a second display unit each including a planar portion for displaying an image from a front of the display device, a curved portion extending from the planar portion and configured to display an image, and a side portion extending from the curved portion and configured to display an image from a side of the display device, the first display unit and the second display unit overlapping along a direction perpendicular to the planar portion of the first display unit and bonded to each other at the side portion of the first display unit; and
   an adhesive layer bonding the first display unit to the second display unit and overlapping the side portion of the first display unit and the side portion of the second display unit along the direction perpendicular to the planar portion of the first display unit, wherein the first display unit includes a first display panel for displaying an image and a first cover window for covering a display side of the first display panel, and wherein the adhesive layer directly contacts both the first display panel and the first cover window.

2. The display device of claim 1, further comprising a combination member for covering the side portion of the first display unit and the side portion of the second display unit, and for combining the first display unit and the second display unit.

3. The display device of claim 2, wherein the combination member includes a transparent material.

4. The display device of claim 3, wherein the combination member includes at least one of a polycarbonate and an acryl.

5. The display device of claim 1, wherein the adhesive layer includes at least one of a pressure sensitive adhesive (PSA), an optically clear adhesive (OCA), a silicone adhesive, and an acryl adhesive.

6. The display device of claim 1, wherein the second display unit includes a second display panel for displaying an image and a second cover window for covering a display side of the second display panel.

7. A display device comprising:
   a first display unit and a second display unit each including a planar portion for displaying an image from a front of the display device, a curved portion extending from the planar portion and configured to display an image, and a side portion extending from the curved portion and configured to display an image from a side of the display device, the first display unit and the second display unit provided to be opposite to each other and bonded to each other at the side portion;
   an adhesive layer bonding the first display unit to the second display unit; and
   a combination member for covering the side portion of the first display unit and the side portion of the second display unit, and for combining the first display unit and the second display unit,
   wherein the combination member includes: a center portion; a first combiner extending toward the planar portion of the first display unit from the center portion, so as to be coupled to the first display unit; a second combiner extending toward the planar portion of the second display unit from the center portion, so as to be coupled to the second display unit; and a support protruding toward the side portions of the first display unit and the second display unit from the center portion.

8. The display device of claim 7, wherein the support extends to an interface between the side portions of the first display unit and the second display unit.

9. The display device of claim 8, wherein a space is provided between at least one of the side portions and the combination member.

10. The display device of claim 7, wherein the combination member further includes: a first fixer provided at an end portion of the first combiner and fixing the combination member to the first display unit; and a second fixer provided at an end portion of the second combiner and fixing the combination member to the second display unit.

11. The display device of claim 7, wherein the first combiner or the second combiner is oriented at an angle of 1 to 89° with respect to one of the side portions.

12. The display device of claim 11, wherein the first combiner or the second combiner is oriented at an angle of 1 to 10° with respect to one of the side portions.

13. A display device comprising:
   a first display unit and a second display unit each including a planar portion for displaying an image from a front of the display device, a curved portion extending from the planar portion and configured to display an image, and a side portion extending from the curved portion and configured to display an image from a side of the display device, the first display unit and the second display unit provided to be opposite to each other and bonded to each other at the side portion;
   an adhesive layer bonding the first display unit to the second display unit; and
   a first cover window and a second cover window each covering the first and second display units,
   wherein the adhesive layer includes an internal-side adhesive region affixed to at least part of each of the side portions, a panel adhesive region affixed to the first display panel and the second display panel, and a window adhesive region affixed to the first cover window and the second cover window, and
   the internal-side adhesive region, the panel adhesive region, and the window adhesive region have different thicknesses.

14. The display device of claim 13, wherein the internal-side adhesive region is thicker than the panel adhesive region, and the panel adhesive region is thicker than the window adhesive region.

15. The display device of claim 13, wherein the adhesive layer further includes a light blocking material.

* * * * *